(12) United States Patent
Schluchter

(10) Patent No.: US 7,362,447 B2
(45) Date of Patent: Apr. 22, 2008

(54) LOW WALK-OFF INTERFEROMETER

(75) Inventor: William Clay Schluchter, Los Altos, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 220 days.

(21) Appl. No.: 11/297,968

(22) Filed: Dec. 9, 2005

(65) Prior Publication Data

US 2006/0087659 A1 Apr. 27, 2006

Related U.S. Application Data

(63) Continuation-in-part of application No. 10/783,199, filed on Feb. 20, 2004, now Pat. No. 7,130,056.

(51) Int. Cl.
*G01B 11/02* (2006.01)

(52) U.S. Cl. .................................................. 356/500

(58) Field of Classification Search ................ 356/493, 356/496, 498, 500, 508; 355/53
See application file for complete search history.

(56) References Cited

U.S. PATENT DOCUMENTS

| | | | |
|---|---|---|---|
| 3,791,739 A * | 2/1974 | Kawasaki | 356/500 |
| 3,815,996 A * | 6/1974 | Colding et al. | 356/500 |
| 4,891,526 A | 1/1990 | Reeds | |
| 5,151,749 A * | 9/1992 | Tanimoto et al. | 356/620 |
| 5,717,482 A | 2/1998 | Akutsu et al. | |
| 6,020,407 A | 2/2000 | Loopstra et al. | |
| 6,208,407 B1 | 3/2001 | Loopstra | |
| 6,650,419 B2 | 11/2003 | Hill | |
| 6,674,510 B1 | 1/2004 | Jasper et al. | |

* cited by examiner

*Primary Examiner*—Michael A. Lyons

(57) ABSTRACT

An interferometer can achieve a high dynamic range for measurements along vertical and horizontal directions using a first measurement channel providing a high dynamic range measurement of a path including components respectively parallel and perpendicular to the optics-object separation and a second measurement channel providing a high dynamic range measurement with just a perpendicular component. Further, using the same techniques at multiple locations around permits a high dynamic range for measurements of the degrees of freedom of an object.

17 Claims, 4 Drawing Sheets

LOW WALK-OFF INTERFEROMETER

CROSS-REFERENCE TO RELATED APPLICATIONS

This patent document is a continuation-in-part and claims benefit of the earlier filing date of U.S. patent application Ser. No. 10/783,199, filed Feb. 20, 2004 now U.S. Pat. No. 7,130,056, which is hereby incorporated by reference in its entirety.

BACKGROUND

A plane mirror interferometer can measure the position and/or orientation of objects such as a precision stage in a wafer processing system. For such use, a plane mirror is typically mounted on the stage being measured, and interferometer directs one or more measurement beams for reflections from the plane mirror. Each measurement beam generally corresponds to a separate measurement channel and is combined with a corresponding reference beam for signal processing that produces the measurement. To reduce angular separation between a measurement beam and the corresponding reference beam, some interferometers (commonly referred to as double-pass interferometers) use retroreflectors to direct each measurement beam back for a second reflection from the plane mirror before the interferometer combines the measurement and reference beams. These double-pass interferometers effectively double the path length of the measurement beam, which can have disadvantages.

Interferometer systems that measure the position and orientation of a stage or other object often need to measure multiple degrees of freedom. For example, a rigid three dimensional object generally has six independent degrees of freedom, e.g., X, Y, and Z coordinates indicating a position relative to an X-axis, a Y-axis, and a Z-axis and roll, pitch, and yaw angles corresponding to rotation of the object about the X-axis, the Y-axis, and the Z-axis. In general, at least two of the measurement axes, e.g., the Y-axis and the Z-axis, define directions having at least a component perpendicular to a separation between the interferometer optics and the measurement mirror. Accordingly, an interferometer system measuring all of the degrees of freedom of an object often uses multiple measurement mirrors and interferometer optics in multiple locations around the stage.

Interferometer systems that measure displacement perpendicular to the optics-mirror separation have been developed to prevent interferometer optics from interfering with other processing system components such as a projection lens. U.S. Pat. Nos. 6,020,964 and 6,650,419, for example, describe interferometer systems capable of measuring an altitude of a stage relative to a projection lens. In such systems, a reflector mounted on a stage reflects a measurement beam from a horizontal incident path (e.g., along an X-axis) to a vertical reflected path (e.g., along a Z-axis). A reflector mounted above the stage reflects the vertically directed measurement beam back to the reflector on the stage, where the measurement beam is redirected to a horizontal return path back to the interferometer optics. The total Doppler shift of the measurement beam thus indicates movement along a path having horizontal and vertical components. A separate measurement channel can measure the horizontal component of the motion, so that the vertical component or an altitude measurement can be extracted.

The dynamic range for each degree of freedom measured is generally limited by mirror rotations (e.g., roll, pitch, or yaw rotations), which can deflect the measurement beam, causing the reflected measurement beam to "walk off" the path required for recombination with a reference beam. An acceptable amount of walk off (and correspondingly the dynamic range for a measurement) in general depends on the beam radius w and the optical path length L extending from the interferometer optics to the measurement mirror. For example, the dynamic range for a conventional double-pass interferometer is typically about w/4L radians when measuring a translation along the separation between the interferometer optics and the measurement mirror. The altitude measurements described in U.S. Pat. Nos. 6,020,964 and 6,650,419 are generally subject to similar dynamic range limitations at least because of the need to measure and subtract a horizontal component. To achieve a large dynamic range, conventional interferometers thus require wide beams and/or short separations between the optics and the objects being measured. Large beam widths and short separations are often difficult to accommodate within the space and functional requirements of many systems including wafer processing equipment. Additionally, accommodating large beams increases the size and cost of optical components in the interferometer.

In view of the limitations of existing interferometers, systems and methods are sought that can improve the dynamic measurement range for measurements using plane mirror interferometers without requiring large optical elements or short separations.

BRIEF DESCRIPTION OF THE DRAWINGS

Use of the same reference symbols in different figures indicates similar or identical items.

DETAILED DESCRIPTION

In accordance with an aspect of the present disclosure, an interferometer can achieve a high dynamic range for measurements along vertical and horizontal directions using a first measurement channel providing a high dynamic range measurement of a path including components respectively parallel and perpendicular to the optics-object separation and a second measurement channel providing a high dynamic range measurement with just a perpendicular component. In accordance with a further aspect of this disclosure, an interferometer system can achieve a high dynamic range for measurements of all six degrees of freedom of a rigid object such as a stage used in processing equipment.

Figure 1:
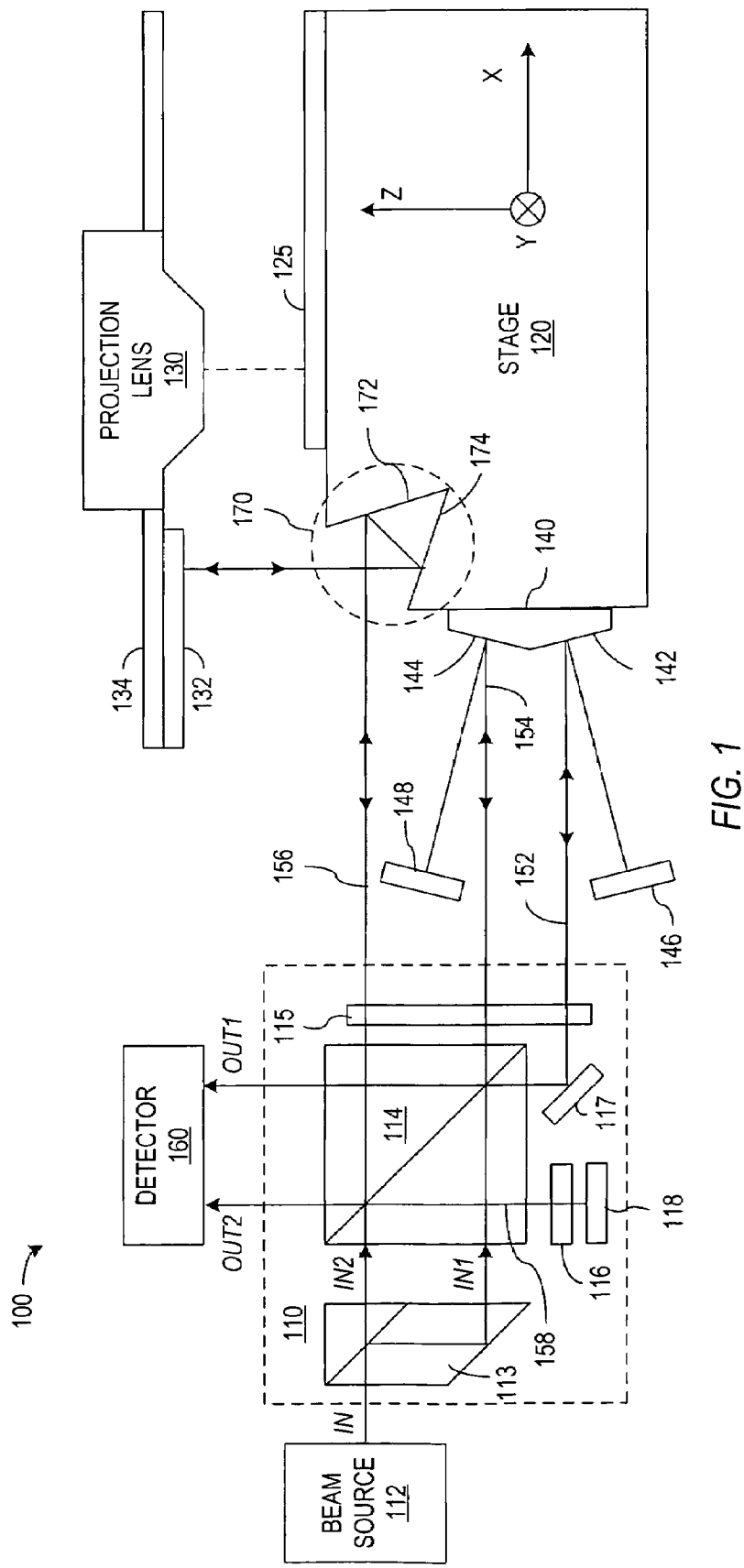
FIG. 1 shows a system including an interferometer providing measurements in horizontal and vertical directions and permitting a wide dynamic range of object orientations.

FIG. 1 illustrates a system 100 that includes interferometer optics 110 for measuring horizontal and vertical translations of an object. In the illustrated embodiment, system 100 is part of photolithography equipment, and the object measured is a stage 120 for positioning of a work piece such a semiconductor wafer 125 relative to a projection lens 130. Interferometer optics 110 preferably has a fixed location relative to projection lens 130. For photolithography, stage 120 and/or a positioning system (not shown) for projection lens 130 must be able to accurately position wafer 125 relative to an optical axis of projection lens 130 so that projection lens 130 can project the desired pattern onto the correct area of wafer 125. Further, stage 120 or a focusing system for projection lens 130 can control or adapt to the separation between wafer 125 and projection lens 130 in order to project a sharply focused pattern. As will be understood by those of skill in the art, measurement of stage 120 in wafer processing equipment is merely an illustrative application of an interferometer system, and more generally, interferometers similar to those described here can measure a variety objects in a variety of systems.

Interferometer optics 110 receives an input beam IN from a beam source 112 and produces three beams 152, 154, and 156 that are initially directed in an X direction toward stage 120. As described further below, beams 152 and 154 are for a first high dynamic range measurement channel that measures translation of stage 120 in a Z direction, and beam 156 is for a second high dynamic range measurement channel for a measurement having components in the Z and X directions. A high dynamic range measurement of translation in the X direction can be found by using the measurement from the first measurement channel to remove the Z component of the combined X and Z motion measured using the second measurement channel.

Interferometer optics 110 in the illustrated embodiment includes beam splitting optics 113, a polarizing beam splitter (PBS) 114, polarization changing elements such as quarter-wave plates (QWPs) 115 and 116, a turning mirror 117, and a reference reflector 118. Beam source 112 directs input beam IN into beam splitting optics 113, which produces two separate beams IN1 and IN2 corresponding to the two measurement channels of system 100. Alternatively, two separate beams sources can directly produce input beams IN1 and IN2.

In one embodiment interferometer 110, each of input beams IN, IN1, and IN2 is a heterodyne beam having a first component with a first frequency F1 and a first linear polarization and a second component having a second frequency F2 and a second linear polarization that is perpendicular to the first linear polarization. Many beam sources are capable of producing a heterodyne beam having the desired properties. Beam source 112 may, for example, be a laser that produces the desired difference in frequencies F1 and F2 through Zeeman splitting and/or with an acousto-optic modulator (AOM). Other sources of heterodyne beams that are known or may be developed may also be suitable. Alternatively, beam source 112 could be a long coherence length single-frequency laser where the required coherence length depends on the difference between the optical path lengths, for example, of measurement beam 156 and its associated reference beam 158. Use of heterodyne beams may be preferred because interferometers using single frequency beams typically require multiple phase measurements to eliminate the effects of beam power fluctuations.

Beam splitting optics 113 in the illustrated embodiment produces channel input beams IN1 and IN2 respectively for the first and second measurement channels of interferometer system 100. Non-polarizing beam splitting is preferred for beam splitting optics 113, so that channel input beams IN1 and IN2 have the same polarization and frequency characteristics as the input beam IN from beam source 112. In particular, input beam IN and channel input beams IN1 and IN2 can all be heterodyne beams with separate frequency components having orthogonal polarizations. An exemplary embodiment using heterodyne beams is described in the following to provide a specific example. However, it should be understood that the description is intended to be illustrative and not limiting.

PBS 114 separates components of input beam IN1 according polarization to produce beams 152 and 154 and similarly separates components of input beam IN2 according polarization to produce beams 156 and 158. As a result, beams 152 and 154 have orthogonal linear polarizations as do beams 156 and 158. When input beams IN1 and IN2 are heterodyne beams, the orientation of the polarization axes of the input beams and PBS 114 are such that the polarization splitting separates the frequency components of each input beam IN1 or IN2. Beams 152, 154, 156, and 158 are thus single-frequency beams in the exemplary embodiment. In the embodiment illustrated, PBS 114 is such that measurement beam 156 has the linear polarization that PBS 114 transmits, and reference beam 158 initially has a linear polarization that PBS 114 reflects. As will be understood by those of skill in the art, alternative embodiments of interferometer optics 110 could use the beam initially reflected in PBS 114 as the measurement beam and use the beam initially transmitted in PBS 114 as the reference beam. Additionally, although the illustrated embodiment shows PBS 114 having a thin polarizing film that is sandwiched between right angle prisms, PBS 114 could be implemented using different structures such as birefringent optical elements that perform the beam splitting and combining functions required of PBS 114. Further, in embodiments using monochromatic input beams, PBS 114 may be replaced by a non-polarizing beam splitter.

System 100 can monitor a relative motion of stage 120 along the horizontal X direction and the vertical Z direction. For the vertical measurement, the first measurement channel uses a measurement reflector 140 providing reflective facets 142 and 144 on stage 120, and the angle that facet 142 makes with a side of stage 120 that is nominally perpendicular to the X axis is supplementary to the angle that facet 144 makes with that side of stage 120. Interferometer optics 110 directs beams 152 and 154 through QWP 115 to respectively reflect from facets 142 and 144. Facets 142 and 144 direct respective beams 152 and 154 to respective Porro prisms 146 and 148, which are oriented to return beams 152 and 154 to reflector 140. When stage 120 has no tilt, the return paths of beams 152 and 154 to respective facets 142 and 144 are parallel to but offset in the Y direction from the respective paths incident on Porro prisms 146 and 148.

Returned beam 152 reflects again from facet 142, passes through QWP 115, reflects from turning mirror 117, and reenters PBS 114. Returned beam 154 reflects again from facet 144, passes through QWP 115 and directly reenters PBS 114. Passing twice through QWP 115 effectively rotates the linear polarization of each of beams 152 and 154 by 90°, so that PBS 114 transmits returned beam 152 and reflects returned beam 154 to form a first output beam OUT1 that enters detector system 160.

Doppler shifts resulting from stage 120 moving in the X direction in the illustrated configuration are the same for the paths of both beams 152 and 154, but movement of stage 120 in the Z direction causes a Doppler shift in beam 152 that is opposite to the Doppler shift caused in beam 154. Accordingly, a beat frequency resulting from the frequency difference of beams 152 and 154 when beams 152 and 154 are combined into beam OUT1 depends on the difference in Doppler shift and therefore indicates the movement of stage 120 in the Z direction. It should be noted that the interferometer system including reflector 140 can be rotated about the X-axis so that the measurement using reflector 140 is no longer vertical along the Z direction but is along any direction perpendicular to the separation between interferometer 110 and stage 120.

Detector system 160 measures or analyzes output beam OUT1 for determination of a displacement of stage 120 in the Z direction. In an exemplary embodiment, detector system 160 measures a difference in the frequencies of beams 152 and 154, and the difference can then be used to determine a difference in the Doppler shifts and therefore the vertical velocity or the displacement of stage 120 along the Z direction. In a heterodyne interferometer where beams 152 and 154 initially have frequencies F1 and F2, the returned beams 152 and 154 will have frequencies F1' and F2' that depend on Doppler shifts that may have occurred as a result of reflections from respective facets 142 and 144 when stage 120 moves. As described above, the angles of facets 142 and 144 are such that X-direction or Y-direction motion of stage 120 causes the same Doppler shift in both beams 152 and 154 but Z-direction motion causes opposite Doppler shifts in beams 152 and 154. Accordingly, horizontal motion of stage 120 does not change the frequency difference F1'-F2' between returned beams 152 and 154, but vertical motion changes the frequency difference F1'-F2'. Conventional light detectors and electronics in detector system 160 can receive output beam OUT1 and produce an electronic signal having the beat frequency F1'-F2'. Similarly, a reference electronic signal having the beat frequency F1-F2 can be produced through direct measurement of a portion of input beam IN or IN1.

An exemplary embodiment of detector system 160 further includes a phase detection circuit that measures the phase of the beat signal having frequency F1'-F2' relative to the reference beat signal having frequency F1-F2. A change in the relative phase indicates that beat frequencies F1'-F2' and F1-F2 differ and permits measurement of a net Doppler shift in output beam OUT1, which indicates a velocity in the Z direction. Integration of the determined velocity component indicates translation along the Z direction.

The measurement of translation in the Z direction using beams 152 and 154 tolerates a wide dynamic range of rotations of stage 120. In particular, Porro prisms 146 and 148 are retroreflectors for rotations of stage 120 about the Z axis. Rotations of stage 120 about the Y axis have effects common to beams 152 and 154. The effect of rotations of the stage 120 about the X axis are cancelled by the Porro prisms 146 and 148 and are minimized by choosing a small angle between reflectors 142 and 144. The first measurement channel also has an optical path length that is shorter than the optical path length of a conventional double-pass measurement channel, resulting in a better dynamic range for the first measurement channel than for a double pass interferometer. U.S. Pat. App. Pub. No. 2005/0185193, entitled "System and Method of using a Side-Mounted Interferometer to Acquire Position Information" further describes similar and other suitable systems with high dynamic range for measuring a perpendicular translation of an object.

Interferometer optics 110 also produces a measurement beam 156 for the second measurement channel. In the illustrated embodiment, measurement beam 156 is the component of input beam IN2 that passes through PBS 114. Measurement beam 156 initially travels in the X direction through QWP 115 to a reflector 170 mounted on stage 120. Reflector 170 is preferably a constant deviation prism such as a Penta prism and directs beam 156 to a reflector 132 on a mounting structure 134 that may be fixed relative to projection lens 130. In an exemplary embodiment, reflector 170 is a Penta prism having a vertex extending in the Y direction in FIG. 1, a reflective surface 172 that is nominally 22.5° from vertical, and a reflective surface 174 that is nominally 22.5° from horizontal; and reflector 132 is an extruded Porro prism having a vertex extending along the X direction. Alternatively, any constant deviation prism or reflector that bends beam 156 by 90 degrees could be used. Reflector 132 is oriented and positioned to reflect measurement beam 156 back to reflector 170 for any permitted position of stage 120. Reflector 170 then returns measurement beam 156 back through QWP 115 to PBS 114. Reflections of measurement beam 156 from stage 120 causes a Doppler shift having components resulting from movement of stage 120 in the X direction and the Z direction, and the two passes through QWP 115 changes the polarization of beam 156 so that returned beam 156 reflects from PBS 114 and forms part of output beam OUT2 for the second measurement channel.

Reference beam 158, which is also used in the second measurement channel, has an optical path that remains within interferometer optics 110 until reference beam 158 and measurement beam 156 are combined in output beam OUT2. In particular, reference beam 158 initially reflects in PBS 114 to a path through QWP 116 to reference reflector 118. Reference reflector 118, which can be a Porro prism or other reflector that produces a reflected beam with an offset matching the offset that reflector 132 produces, returns reference beam 158 through QWP 116 to PBS 114, where reference beam 158 then passes through PBS 114 to form part of output beam OUT2.

Changes in the beat frequency resulting when measurement beam 156 is combined with reference beam 158 indicate the total Doppler shift caused by reflections of measurement beam 156 from stage 120. Detector system 160 can determine the total Doppler shift for the second measurement channel in the same manner that the net Doppler shift is found for the first measurement channel. As noted above, the total Doppler shift is the sum of a Doppler shift associated with motion of stage 120 in the X direction and a Doppler shift associated with motion of stage 120 in the Z direction. The direction of motion of stage 220 that maximizes the phase difference between beams 156 and 158 is parallel to the vector having equal components in the positive X direction and the negative Z direction. However, since first measurement channel produces a measurement of motion in the Z direction, information from both measurement channels can be combined to measure motion in the X direction.

The second measurement channel provides a high dynamic range measurement because reflector 170, e.g., a Penta Prism, can provide a relatively consistent vertical path for beam 158 for a large range of pitch rotations of stage 120 about the Y-axis, Porro prism 170 similarly acts as a retroreflector that compensates for roll rotations of stage 120 about the X-axis. Additionally, Porro prism 132 compensates for stage 120 rotations about both the X-and Z-axes. Again, the optical path length for the second measurement channel is generally shorter than the optical path length for a conventional double-pass interferometer, giving the second measurement channel of system 100 a better dynamic range. Further description of operation and alternative embodiments of some interferometer systems suitable for the second measurement channel of system 100 can be found in U.S. Pat. No. 6,650,419. The resulting measurement of horizontal translation along the X-axis, which is achieved through combination of measurements from the first and second measurement channels, has high dynamic range for rotations of stage 120 because both measurement channels are tolerant to rotations of stage 120.

Figure 2:
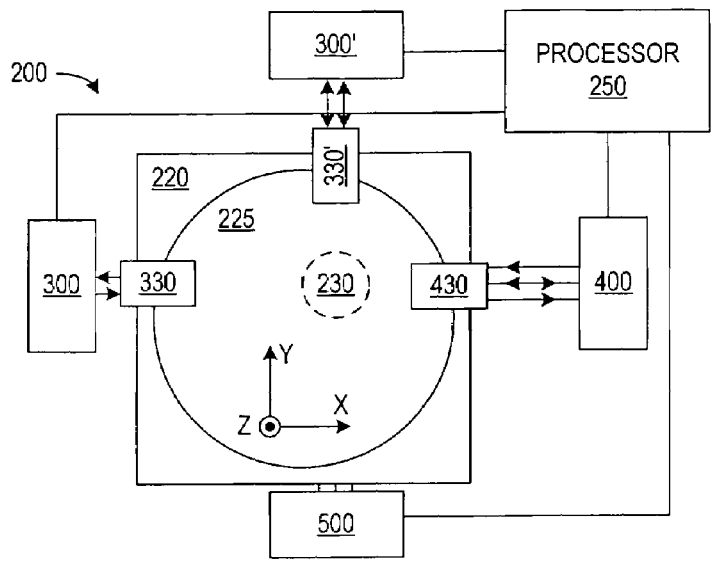
FIG. 2 is a plan view of a system including an interferometer that measures all six degrees of freedom of a rigid object.

In accordance with another aspect of this disclosure, an interferometer system can provide high dynamic range for measuring six degrees of freedom of an object such as a wafer stage. Generally, measuring six degrees of freedom is simplified by performing measurement from different locations around the object being measured. FIG. 2, for example, shows a system 200 having interferometer systems 300, 300', 400, and 500 in four locations around a stage 220 being measured. This embodiment is a lithography system with interferometer systems 300, 300', 400, and 500 having fixed locations relative to a projection lens 230. Stage 220 moves as required to position and orient a wafer 225 relative to projection lens 230. Reflectors 330, 330', and 430 may be mounted above or below stage 320 and are used for measurement of vertical motion of stage 220.

A processor 250, which may be a general purpose computer executing appropriate software, can combine measurements from different channels of one or more interferometer systems 300, 300', 400, or 500 to determine a specific measurement, e.g., to determine an X measurement from signals respectively corresponding to an X-Z measurement and a Z measurement as described above. Processor 250 can also combine measurement signals from separate interferometer systems 300, 300', 400, and 500 to accurately determine rotation measurements as described further below.

Figure 3A:
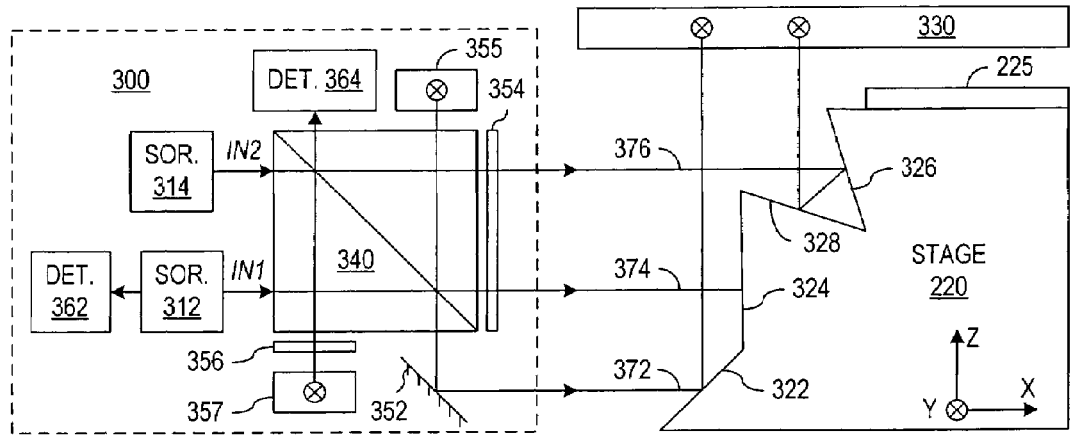
FIG. 3A is a side view of another embodiment including an interferometer providing measurements in horizontal and vertical directions and permitting a wide dynamic range of object orientations.

Interferometer system 300 in an exemplary embodiment of system 200 is used to measure horizontal motion along an X direction in FIG. 2 and vertical motion along a Z direction. As described above, interferometer system 100 of FIG. 1 can measure both horizontal and vertical motion and can be used for system 300. However, FIG. 3A shows an alternative embodiment of interferometer system 300 that is similar to system 100 but has a first measurement channel that uses a different technique for measuring the displacement in the Z direction.

The first measurement channel of interferometer system 300 uses a beam source 312, a PBS 340, a turning mirror 352, a first measurement reflector 322, vertically-displaced reflector 330, a polarization changing element (e.g., QWP) 354, a reference reflector 324, a retroreflector 355, and a detector system 362. Beam source 312 produces an input beam IN1, which in an exemplary embodiment is a heterodyne beam as described above. PBS 340 splits input beam IN1 into a measurement beam 372 and a reference beam 374. Measurement beam 372 in the illustrated embodiment reflects from PBS 340 and then reflects from turning mirror 352 and heads in the X direction to measurement reflector 322.

Measurement reflector 322 is a plane mirror mounted on stage 220 at an angle (preferably 45°) from the X axis. Measurement reflector 322 reflects measurement beam 372 from the horizontal X direction to the vertical Z direction. On the vertical path, measurement beam 372 encounters reflector 330, which in the exemplary embodiment is a Porro prism having a vertex aligned with the center of lens 130. Reflector 330 returns measurement beam 372 to measurement reflector 322 along a path that is vertical and offset in the Y direction. Measurement beam 372 then reflects from measurement reflector 322, turning mirror 352, and PBS 340 and forms part of an output beam to detector system 362.

Reference beam 374 from PBS 340 passes through QWP 354 and reflects from reflector 324. In the exemplary embodiment, reflector 324 is a plane mirror that mounted on stage 220 and is nominally perpendicular to the X axis. When stage 220 has no tilt, reference beam 374 returns from reference mirror 324 along the same path, passes through QWP 354, and enters PBS 340. The first two passes through QWP 354 changes the polarization of reference beam 374, so that reference beam 374 then reflects from PBS 340 toward retroreflector 355. Retroreflector 355 is preferably a Porro prism that gives the reflected reference beam 374 the same offset that Porro prism 330 provides to measurement beam 372. From retroreflector 355, reference beam 374 reflects in PBS 340, passes through QWP 354, reflects a second time from reflector 324, returns through QWP 354, and then passes through PBS 340 to join measurement beam 372 in the output beam to detector 362.

Figure 3B:
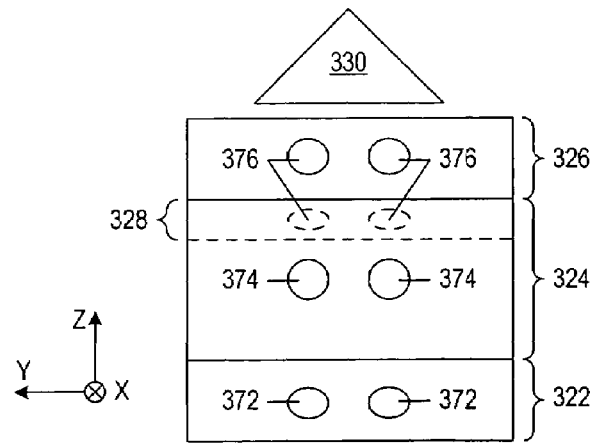
FIG. 3B shows a measurement reflector and the reflection areas for beams produced in the system of FIG. 3A.

FIG. 3B shows areas of reflectors 322 and 324 where beams 372 and 374 reflect from stage 220. Measurement beam 372 reflects twice from measurement reflector 322 and each time receives a Doppler shift having a component corresponding to movement of stage 220 in the X direction and movement of stage 220 in the Z direction. Reference beam 374 similarly reflects twice from reflector 324 on stage 220 and each time receives a Doppler shift that depends on the velocity of stage 220 in the X direction. If stage 220 moves in the Z direction, only beam 372 will be Doppler shifted. Motion of stage 220 in the X direction creates twice the Doppler shift in beam 374 relative to beam 372, and the direction of motion of stage 220 that maximizes the phase difference between beams 372 and 374 is parallel to a vector having equal components in the X and Z directions. The measured frequency is the rate of change of the phase difference between beams 372 and 374 and indicates the velocity along the vector having equal X and Z components. This first measurement channel provides a high dynamic range measurement because Porro prism 330 acts as a retroreflector that compensates for roll rotation of stage 220 and because other rotations of stage 220 affect both measurement beam 372 and reference beam 374. In general, yaw rotation affects beams 372 and 374 in different amounts but will be compensated by reflectors 330 and 355, respectively. U.S. Pat. App. Ser. No. 11/205,368, entitled "Interferometer for Measuring Perpendicular Translations," further describes similar and suitable alternative embodiments for measurement channels measuring vertical displacements.

The second measurement channel of interferometer system 300 in FIG. 3A includes a beam source 314 that produces input beam IN2 but otherwise operates in substantially the same manner as the second measurement channel of system 100 of FIG. 1. In particular, for the second measurement channel of interferometer system 300, PBS 340, QWP 354, reflectors 326 and 328, Porro prism 330, QWP 356, Porro prism 357, and detector system 364 may have the same construction and perform the same functions as PBS 114, QWP 115, reflectors 172 and 174, Porro prism 132, QWP 116, reference reflector 118, and detector system 160, respectively. The description of these elements and functions are above. Because the first measurement channel of interferometer system 300 produces a maximum phase difference for stage motion in the X+Z direction and the second measurement channel of interferometer system 300 produces a maximum phase difference for stage motion in the X−Z direction, these channels measure two orthogonal directions in the XZ plane. Stage motion in the X and Z directions can therefore be calculated with maximum resolution from the measurement results of the two channels of system 300.

Interferometer system 300' of FIG. 2 in an exemplary embodiment also measures horizontal and vertical movement of stage 220. However, interferometer system 300' is positioned so that the separation between system 300 and stage 220 is along the Y direction. Systems 300' like system 300 can be implemented, for example, using interferometer systems of the types illustrated by FIG. 1 or FIG. 3A.

Interferometer systems 300 and 300' together provide measurements of stage motion in X, Y, and Z directions. Systems 300 and 300' measure different points on stage 220 and therefore provide some information regarding rotation of stage 220. For example, a non-zero roll angle or pitch angle tilting of stage 220 will cause the Z measurement from system 300 to differ from the Z measurement from system 300'. Rotations of stage 220 can further be measured using additional interferometer systems either at the same locations as systems 300 and/or 300' or at the locations of interferometer systems 400 and/or 500.

Figure 4A:
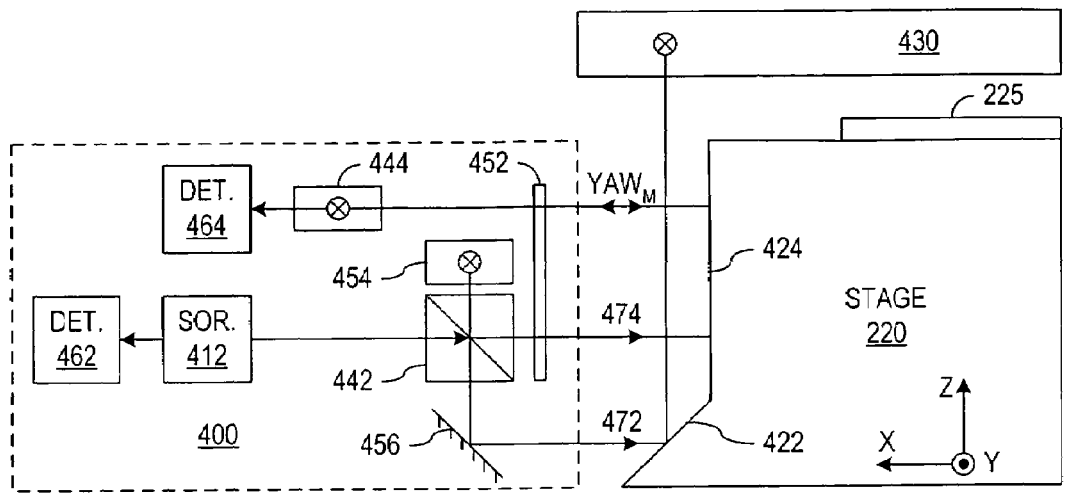
FIGS. 4A and 4B are respectively side and top views of an embodiment including an interferometer providing measurements of yaw angle and horizontal motion and permitting a wide dynamic range of object orientations.
Figure 4B:
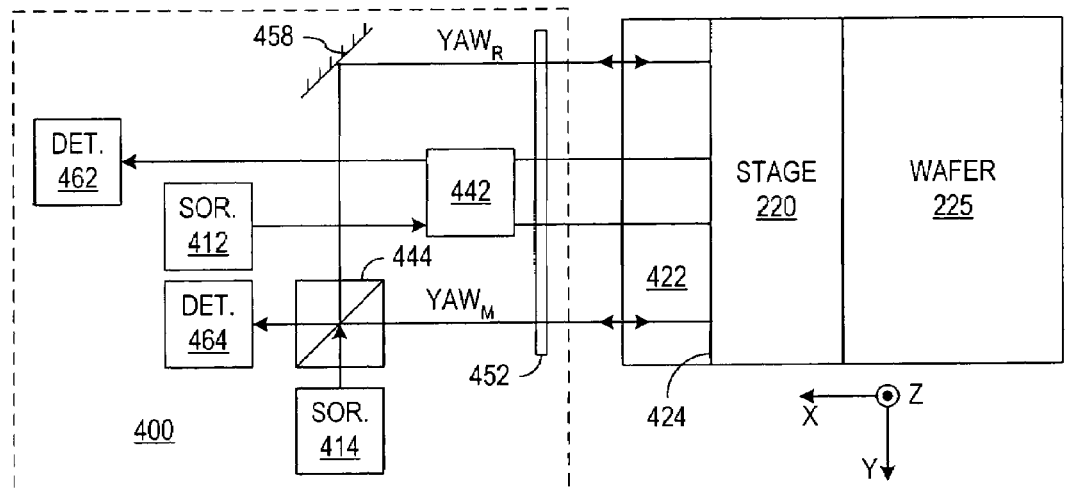

FIGS. 4A and 4B respectively illustrate side and top views of an interferometer system 400, which may be positioned opposite interferometer system 300 as shown in FIG. 2. In this embodiment, interferometer system 400 has a first measurement channel that measures an X+Z translation and a second measurement channel that measures a yaw angle rotation of stage 220 about the Z axis. Interferometer system 400 measures X+Z translation from which Z translation at a point on stage 220 opposite to the measurement point of interferometer system 300, and Z measurements determined from systems 300 and 400 can be used to determine a pitch rotation of stage 220. Further, a roll angle rotation about the X axis can be determined from the combination of the Z measurement from interferometer system 300', which measures a point offset in Y direction from the points that systems 300 and 400 measure, and the Z measurements from systems 300 and 400. Accordingly, systems 300, 300', and 400 are sufficient for measuring the six degrees of freedom (e.g., X, Y, Z, pitch, yaw, and roll) of stage 220.

The first measurement channel of interferometer system 400 uses a beam source 412, a PBS 442, a turning mirror 456, a measurement reflector 422, Porro prism 430, a polarization changing element (or QWP) 452, a reference reflector 454, and a detector system 462 that can respectively have the same construction and operation as beam source 312, PBS 340, turning mirror 352, measurement reflector 322, Porro prism 330, QWP 354, reference reflector 355, and detector system 362 of FIG. 3A. Alternatively, interferometer system 400 can measure motion in the Z direction using the structures and techniques described above for the first measurement channel of system 100 of FIG. 1. Either embodiment provides a high dynamic range for the Z direction measurement, as a result a pitch rotation measurement using the Z measurements from systems 300 and 400 has a high tolerance for tilt of stage 220. Additionally, systems 300 and 400 performing Z measurements at opposite ends of stage 220 causes pitch rotations to have a maximal effect on the difference in Z measurements, improving pitch measurement accuracy.

FIG. 4B best illustrates the second measurement channel of interferometer system 4B. As shown, the second measurement channel is an angle interferometer that uses a beam source 414, a PBS 444, a polarization changing element 452, a turning mirror 458, planar reflector 424, and a detector system 464. PBS 444 splits an input beam from beam source 414 to produce a pair of beams $YAW_M$ and $YAW_R$. In the illustrated embodiment, beam $YAW_M$ initially reflects from PBS 444 and passes through QWP 452 on the way to planar reflector 424. Beam $YAW_M$ then reflects from reflector 424, returns through QWP 452, and has the polarization that passes through PBS 444 to form part of an output beam to detector 464. Beam $YAW_R$ initially passes through PBS 444, reflects from turning mirror 458, and passes through QWP 452 on the way to planar reflector 424. Beam $YAW_R$ reflects from reflector 424, returns through QWP 452, and then has the polarization that reflects in PBS 444 to form part of an output beam to detector 464.

Figure 4C:
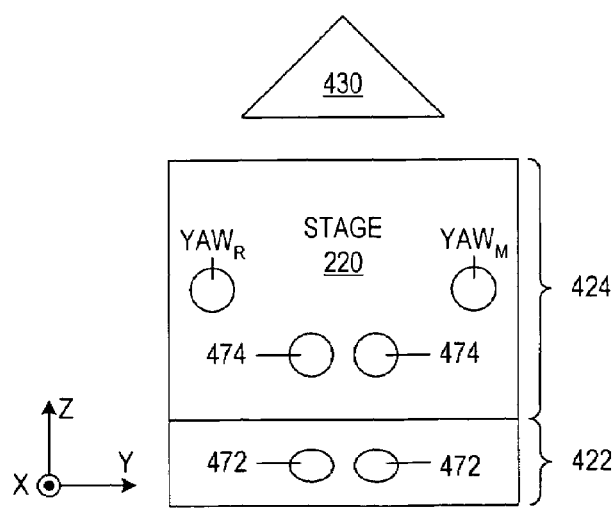
FIG. 4C shows a measurement reflector and the reflection areas for beams produced in the system of FIGS. 4A and 4B.

Both beams $YAW_M$ and $YAW_R$ when reflecting from reflector 424 receive Doppler shifts that indicate the velocity of stage 220 in the X direction. Accordingly, any changes in the frequency difference between beams $YAW_M$ and $YAW_R$ at detector 464 indicates a difference in the X velocities at points separated in the Y direction on stage 220 and therefore indicates rotation of stage 220 about the Z axis. As shown in FIG. 4C, the separation between the reflection areas of beams $YAW_M$ and $YAW_R$ on reflector 424 is preferably large to increase the velocity difference caused by yaw rotations. In contrast, the separation of reflection areas of reference beams 474 on reflector 424 and the separation of reflection areas of measurement beams 472 on reflector 422 are smaller to minimize the effects of stage rotation.

Interferometer systems 300, 300', and 400 in the exemplary embodiment system 200 of FIG. 2 collectively provide high dynamic range measurements of motion in X, Y, and Z directions and pitch, yaw, and roll rotations. However, interferometer system 200 of FIG. 2 can optionally employ interferometer system 500 to provide redundant measurements and/or improve the accuracy of the measurements. In one embodiment, interferometer system 500 performs a high dynamic range measurement of Z motion at a point on stage 220 opposite to when interferometer system 300' measures the Z motion. Such a Z motion measurement can be performed, for example, using a structure and process of the type described above in regard to FIG. 1 or FIG. 3A. The large separation along the Y direction of the Z velocity measurements maximizes the measurement signal for accurate measurement of roll rotations.

Figure 5A:
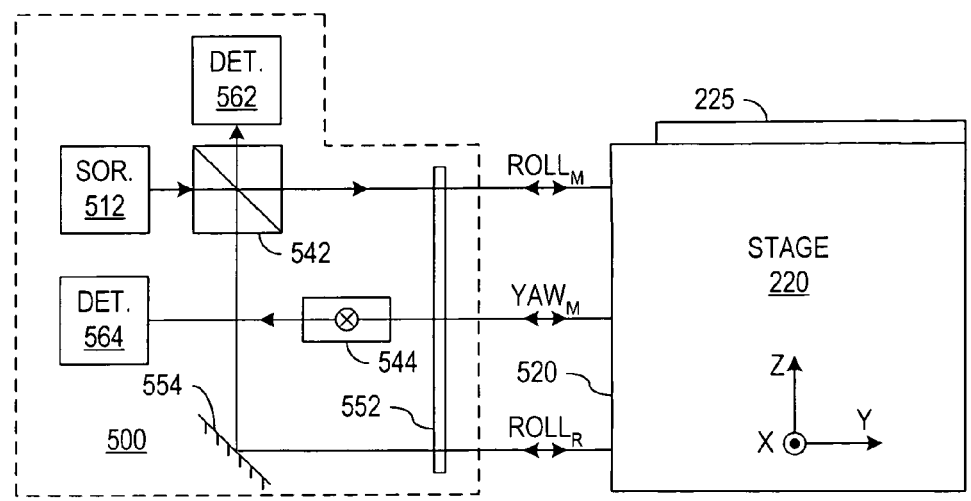
FIGS. 5A and 5B are respectively side and top views of an embodiment including an interferometer providing angle measurements about two perpendicular axes and permitting a wide dynamic range of object orientations.
Figure 5B:
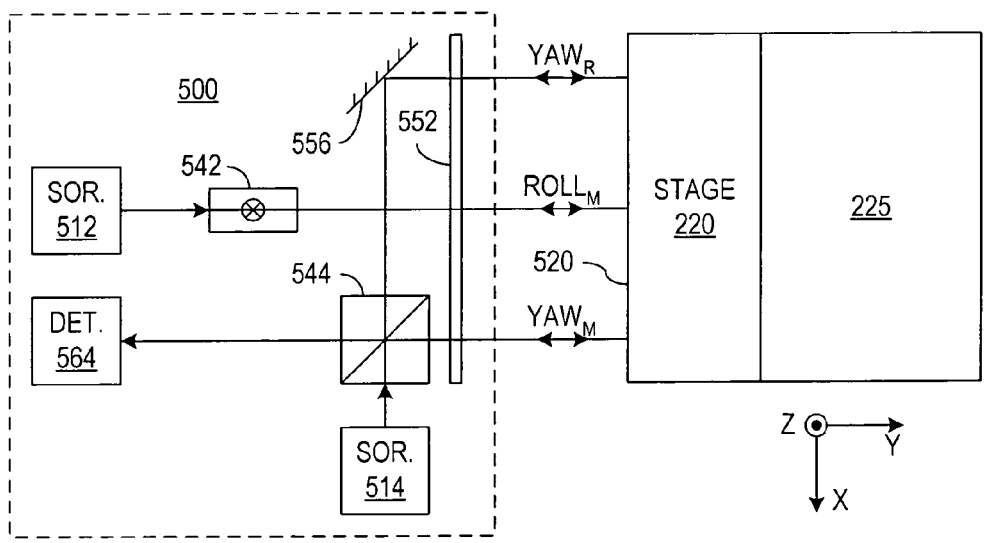

Roll angle rotations can alternatively be measured using an angle interferometer that is similar to the second measurement channel of interferometer system 400 of FIG. 4B but is oriented to provide a separation along the Z direction between reflection areas on a planar reflector perpendicular to the Y axis. FIGS. 5A and 5B shows an embodiment of interferometer system 500 that measures both the roll and yaw rotations of stage 220.

FIG. 5A best illustrates a first measurement channel of interferometer system 500. In this embodiment, the first measurement channel is an angle interferometer that differs somewhat in geometry from the angle interferometer that forms the second measurement channel of interferometer system 400 of FIG. 4B. The roll angle interferometer in interferometer system 500 uses a beam source 512, a PBS 542, a polarization changing element (e.g., a QWP) 552, a planar reflector 520, a turning mirror 554, and a detector system 562. PBS 542 splits an input beam from beam source 512 to produce a pair of beams $ROLL_M$ and $ROLL_R$. In the illustrated embodiment, beam $ROLL_M$ initially passes through PBS 542 and QWP 452 on the way to planar reflector 520. Beam $ROLL_M$ reflects from reflector 520, returns through QWP 552, and then has the polarization that reflects in PBS 542 to form part of an output beam to detector 562. Beam $ROLL_R$ initially reflects in PBS 542, reflects from turning mirror 554, and passes through QWP 552 on the way to planar reflector 520. Beam $ROLL_R$ then reflects from reflector 520, returns through QWP 552, and then has the polarization that passes through PBS 542 to form part of an output beam to detector 562.

Figure 5C:
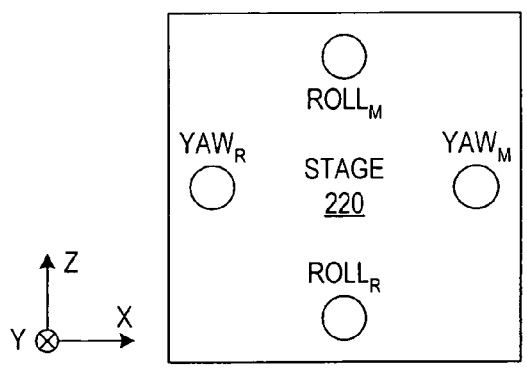
FIG. 5C shows a measurement reflector and the reflection areas for beams produced in the system of FIGS. 5A and 5B.

A difference in the Doppler shifts of beams $ROLL_M$ and $ROLL_R$ caused by reflections from planar reflector 520 indicate difference in Y velocities of points separated in the Z direction, and therefore indicate roll rotations about the X axis. Accordingly, detector system 562 can measure the changes in the frequency difference between beams $ROLL_M$ and $ROLL_R$ and determine the roll rotations of stage 220. As shown in FIG. 5C, the separation between reflection areas of beams $ROLL_M$ and $ROLL_R$ on reflector 520 should be as large as possible to improve measurement accuracy.

FIG. 5B illustrates that interferometer system 500 can also include a second measurement channel to perform an alternative or redundant yaw rotation measurement. In the illustrated embodiment, the second measurement channel is an angle interferometer that has a different orientation but the same structure as the second measurement channel of interferometer system 400. In particular, the second measurement channel of interferometer system 500 uses a beam source 514, a PBS 544, a QWP 552, measurement reflector 520, a turning mirror 556, and a detector electronics 564 that can be constructed and can perform substantially the same as beam source 414, PBS 444, QWP 452, turning mirror 458, reflector 424, and detector electronics 464 of FIG. 4B.

The exemplary embodiment interferometer system of 200 of FIG. 2 can thus measure six degrees of freedom of stage 220 by performing different measurements in different subsystems 300, 300', 400, and 500. However, subsystems can be rearranged in a variety of ways to perform different measurements in different systems and/or to eliminate some of subsystems 300, 300', 400, and 500 entirely.

Although this disclosure describes particular embodiments of systems and processes, the description only provides examples of systems and processes according to the present teachings which should not be taken as a limitation of the claims. For example, although the above disclosure concentrated on interferometer measuring Doppler shifts to identify object velocity, interferometers in accordance with alternative embodiments could measure phase differences to directly measure distances. Various other adaptations and combinations of features of the embodiments disclosed will occur to one of ordinary skill in the art given benefit of the present teachings and are, therefore, within the scope of the appended claims.

What is claimed is:

1. An interferometer system, comprising:
   a first measurement channel that provides a first signal indicating a measurement along a path having a at least a component along a first direction perpendicular to a second direction to an object being measured;
   a second measurement channel that provides a second signal indicating a measurement along a path having a first component along the first direction and a second component along the second direction; and
   a processing system that uses the first measurement signal and the second measurement signal to determine a measurement along the second direction.

2. The system of claim 1, wherein the second measurement channel comprises:
   a first reflector mounted on the object,
   a second reflector separated in the first direction from the object;
   interferometer optics that directs a measurement beam in the second direction to the first reflector where the measurement beam reflects from the first reflector to the second reflector, returns from the second reflector to the first reflector;
   a detector system that generates the second signal from the measurement beam and a reference beam associated with the measurement beam.

3. The system of claim 2, wherein each of the first reflector and the second reflector comprises a constant deviation prism.

4. The system of claim 2, wherein the first reflector comprises a Penta prism.

5. The system of claim 2, wherein the second reflector comprises a Porro prism having a vertex along the second direction.

6. The system of claim 1, wherein the first measurement channel comprises:
   first and second reflective facets mounted on the object, the first reflective facet being at an angle to the second reflective facet and the first and second reflective facets being non parallel to either the first or second directions;
   interferometer optics including a beam combiner and positioned to direct a first beam in the second direction for impingement of the first reflective facet and to direct a second beam in the second direction for impingement of the second reflective facet;
   a detector system that generates the first signal from the first and second beams after respective reflections from the first and second facets; and
   beam-steering members located with respect to the first and second reflective facets to manipulate the first and second beams to reach the detector system.

7. The system of claim 1, wherein the second measurement channel comprises:
   a measurement reflector mounted on the object and oriented to redirect a measurement beam from traveling in the second direction to traveling in the first direction;
   a reference reflector oriented to redirect a reference beam traveling in the first direction back in an opposite direction;
   an optical system that directs the measurement beam in the second direction for a single pass to the measurement reflector and directs the reference beam in the first direction for a first pass to the reference;
   an overlying reflector that is separated in the first direction from the object and is positioned to direct the measurement beam back to the measurement reflector that then redirects the measurement beam back to the optical system; and
   a detector system that generates the second signal from the measurement and reference beams.

8. The system of claim 1, wherein a first optical system that is separated along the second direction from the object manipulates beams that the first measurement channel and the second measurement channel employ to respectively generate the first signal and the second signal.

9. The system of claim 1, further comprising:
   a third measurement channel that provides a third signal indicating a measurement along a path having a first component along a third direction and a second component along the second direction, wherein the third direction is perpendicular to the first and second directions; and a fourth measurement channel that provides a fourth signal indicating a measurement having at least a component along the first direction, wherein;

the processing system uses the third measurement signal and the fourth measurement signal to determine a measurement along the third direction; and a second optical system that is separated along the third direction from the object manipulates beams that the third measurement channel and the fourth measurement channel employ to respectively generate the first signal and the second signal.

10. The system of claim 9, wherein the measurements along the first, second, and third directions provide Z, X, and Y measurements of the object.

11. The system of claim 9, further comprising a fifth measurement channel that provides a fifth signal indicating a measurement having at least a component along the first direction, wherein the fifth measurement channel and the first measurement channel employ measurement reflectors that are on opposite sides of the object.

12. The system of claim 11, further comprising a sixth measurement channel that measures rotation of the object about the first direction.

13. The system of claim 1, wherein the object comprises a stage for positioning of a work piece in a lithography system.

14. A method for measuring an object, comprising:
operating a first measurement channel in an interferometer system to determine a first measurement along a path having a at least a component along a first direction perpendicular to a second direction to an object being measured;
operating a second measurement channel of the interferometer system to determine a second measurement along a path having a first component along the first direction and a second component along the second direction; and
determining from the first measurement and second measurement a third measurement that is along the second direction.

15. The system of claim 14, wherein operating the second measurement channel comprises:
directing a measurement beam in the second direction at a first reflector that is mounted on the object and oriented to reflect the measurement beam to a second reflector that is separated in the first direction from the object;
forming a combined beam from the measurement beam after reflection from the first and second reflectors with a reference beam; and
measuring the combined beam for a process that determines the second measurement.

16. The method of claim 14, wherein operating the first measurement channel comprises:
directing a first beam in the second direction for impingement of a first reflective facet on the object; and
directing a second beam in the second direction for impingement of a second reflective facet, wherein the second reflective facet is at an angle to the first reflective facet and the first and second reflective facets are non-parallel to either the first or second directions; and
measuring a combination of the first and second beams after respective reflections from the first and second facets.

17. The method of claim 14, wherein operating the second measurement channel comprises:
directing a measurement beam in the second direction for a single pass to the measurement reflector, wherein the single pass includes reflection from a first reflector on the object and reflection from a second reflector that is separated from the object in the first direction;
directing a reference beam in the first direction for a first pass to and from a third reflector; and
measuring a combination of the measurement beam and the reference beam, when the measurement beam has completed the single pass and the reference beam has completed the first pass.

* * * * *

UNITED STATES PATENT AND TRADEMARK OFFICE
CERTIFICATE OF CORRECTION

PATENT NO. : 7,362,447 B2  Page 1 of 1
APPLICATION NO. : 11/297968
DATED : April 22, 2008
INVENTOR(S) : Schluchter It is certified that error appears in the above-identified patent and that said Letters Patent is hereby corrected as shown below:

In column 11, line 58, in Claim 1, after "having" delete "a".

In column 12, line 51, in Claim 7, after "reference" delete ";" and insert -- reflector; --, therefor.

In column 13, line 33, in Claim 14, after "having" delete "a".

Signed and Sealed this

Twenty-sixth Day of August, 2008

JON W. DUDAS
*Director of the United States Patent and Trademark Office*